AMPLIFICATION OF SHORT AND ULTRA SHORT ELECTROMAGNETIC WAVES

Filed Dec. 7, 1959

United States Patent Office 3,214,704

Patented Oct. 26, 1965

3,214,704

AMPLIFICATION OF SHORT AND ULTRA SHORT ELECTROMAGNETIC WAVES

Herbert Holzwarth, Stockdorf, near Munich, Germany, assignor to Siemens & Halske Aktiengesellschaft, Berlin and Munich, a corporation of Germany Filed Dec. 7, 1959, Ser. No. 857,859
Claims priority, application Germany, Dec. 5, 1958, S 60,837
5 Claims. (Cl. 330—10)

This invention relates to amplification of electromagnetic waves and is particularly concerned with an arrangement for low noise level amplification of short and ultra short electromagnetic waves employing a reactance modulator.

Amplifiers of the above noted kind which are also referred to as parametric amplifiers and described, for example, in Proceedings of the I.R.E., July 1956, pages 904 to 913, employ a modulator with a non-linear reactance to which are conducted the waves to be amplified and also a superimposing oscillation of higher frequency. Owing to the non-linear properties of the reactance which is, for example, a germanium diode operated in the blocking range and acting as a capacitance, there are produced side bands lying above and below the superimposed frequency. A reduction in attenuation of the modulator input is effected by terminal means for the reactance modulator containing an active component for the frequencies lying below the superimposed oscillation. The modulator operates in such case similar to a negative resistance and therefore can be used in known manner for the amplification. The side band lying below the superimposed oscillation is also referred to as unstable side band because the reduction in attenuation can go so far that it leads to self excitation of the source of the waves to be amplified.

The various objects and features of the invention will appear in the course of the description which will be rendered below with reference to the accompanying drawing in which FIG. 1 shows in schematic manner a parametric amplifier of the above noted kind;

Figure 1:
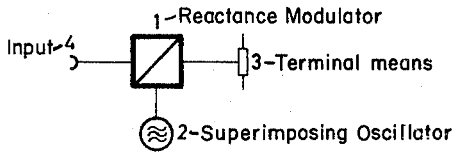

In FIG. 1, numeral 1 indicates the reactance modulator, numeral 2 is the superimposing oscillator which is also referred to as pump oscillator, and numeral 3 indicates the previously mentioned terminal means, a terminal impedance, for the modulator. The input of the parametric amplifier is indicated by numeral 4.

Figure 2:
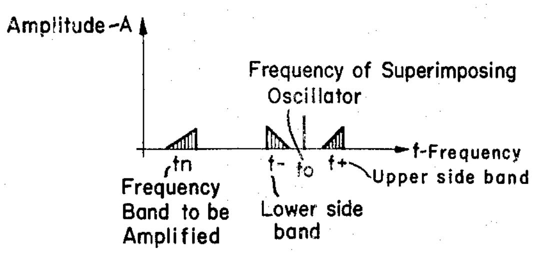
FIG. 2 illustrates the frequency conditions.

The frequency conditions are diagrammatically represented in FIG. 2, wherein A designates the amplitude of the waves, $f_n$ the frequency band to be amplified, $f_0$ the frequency of the superimposing oscillator, and $f-$ and $f+$ indicating respectively the lower and the upper side bands; $f-$ being the unstable side band and $f+$ being the stable side band.

A disadvantage of amplifiers of this kind resides in the fact that the amplification is with negative resistances at appreciable amplification values generally relatively unstable and that the band widths always decrease with decreasing attenuation. The significance of the advantage of such amplifiers, which resides in low inherent noise level, is consequently diminished.

The object of the invention is to show a way for overcoming these difficulties.

This object is according to the invention realized by connecting to the output of a reactance modulator, with interposition of a side band filter, a frequency converter, connecting the reactance modulator and the frequency converter with a preferably common superimposing oscillator the frequency of which is higher than that of the waves to be amplified, and providing means for extracting from the frequency converter the mixture product of lower frequency position.

It is in connection with such an amplifying arrangement of advantage to provide a side band filter which is constructed and dimensioned so that it passes the stable side band while acting for the unstable side band as an idler or as a short circuit. However, it may in some cases be desirable to dimension and to construct the side band filter, for increasing amplification, so that it passes the stable side band while having for the unstable side band in its input impedance an active component so large that there will be produced a predetermined reduction in attenuation at the input of the reactance modulator. It is moreover desirable, for reasons of high efficiency and to avoid distortions based upon reflection, to construct and to dimension the side band filter so that it terminates the reactance modulator at least nearly free of reflection for the stable side band.

Figure 3:
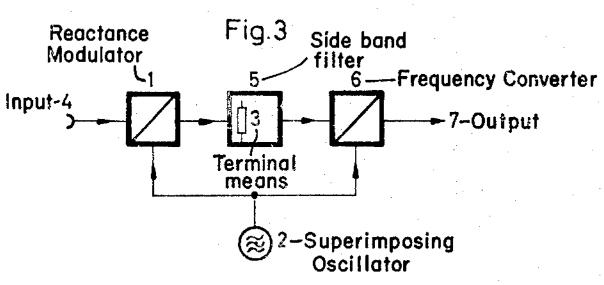
FIG. 3 represents an embodiment according to the invention.

An example of an embodiment of the invention will now be described with reference to FIG. 3.

In FIG. 3, numeral 1 again designates the reactance modulator which is as in FIG. 1 supplied from a pump oscillator 2 and to the input 4 of which are conducted the waves to be amplified. To the output of the reactance modulator 1 is connected a side band filter 5 which filters out the stable side band ($f+$ in FIG. 2) and conducts it to the frequency converter 6 which is likewise supplied from the pump oscillator 2. At the output 7 of the frequency converter 6 is obtained, by way of a filter (not shown) the mixture product of low frequency position which has the same frequency position as the waves at the input 4 which are to be amplified.

It shall be assumed, for example, that the waves conducted to the input 4 have a frequency in the range of decimenter waves, for example, 500 megacycles, while the superimposed oscillations from the pump oscillator 2 have a considerably higher frequency, for example, 8000 megacycles. The side band filter 5 filters out the side band lying at 8500 megacycles and is, so far as its input impedance is concerned, dimensioned as mentioned before. The frequency converter 6 may in such case be a customary diode converter (see, for example, Meinke/Gundlach, "Taschenbuch der Hochfrequenztechnik," published by Springer, 1956, pages 916–917), especially a crystal diode, which has generally a conversion loss of a few decibels. The amplified wave with 500 megacycles will then be available at the output 7 for further use thereof. A relatively low output, for example, 10 to 100 milliwatt will suffice for the pump oscillator 2 in the case of amplification of small signals which are to be amplified with low noise level.

A great advantage of the invention resides in the fact that it is in the described manner possible to construct an extraordinarily noise free amplifier for short and ultrashort electromagnetic waves, exhibiting at great band widths stable behavior and the amplification of which, assuming that no reduction in attentuation is employed, depends solely on the ratio of the pump frequency to the frequency of the waves to be amplified. The higher this ratio is, the higher will be the amplification obtained. The application of the described amplification principle therefore is at the present time merely limited by the frequencies which can be produced by the pump oscillator with sufficient output. In case an attenuation reduction is additionally applied, it may be held considerably lower than in prior arrangements in which the amplification is based exclusively upon attenuation reduction. The dedamping is in the case of the invention accordingly less disturbing than in previously known arrangements.

The amplifier device described with reference to the illustrated embodiment moreover exhibits in the range of decimeter waves and also meter waves the great advantage, due to the use of the pump oscillator for supplying the reactance modulator and also the frequency converter, that frequency fluctuations of the pump oscillator are without effect on the output frequency.

The invention is also useful for amplification which does not require a low noise level, for example, for wide band output amplification. In such case, it is merely necessary to take care to obtain a sufficiently high frequency output of the pump oscillator.

Changes may be made within the scope and spirit of the appended claims which define what is believed to be new and desired to have protected by Letters Patent.

I claim:

1. An amplifier arrangement for low noise level amplification of short and ultra short electromagnetic waves, comprising a reactance modulator and means for conducting waves thereto which are to be amplified, an oscillator, the frequency of which is higher than the waves to be amplified, operatively connected to said reactance modulator with the output from the latter including side bands above and below the oscillator frequency, a frequency converter, a side band filter operatively connecting the output of said reactance modulator to said frequency converter, said oscillator being operatively connected to said frequency converter, the latter being operative to convert the sideband frequency passed by said filter and produce an amplified wave at the original input frequency.

2. An amplifier arrangement according to claim 1, wherein said side band filter is constructed to pass the stable side band while acting for the unstable side band as idler or as a short circuit.

3. An amplifier arrangement according to claim 1, wherein said side band filter is constructed to pass the stable side band while having for the unstable side band an active component in its input impedance to produce a predetermined reduction of attentuation at the input of said reactance modulator.

4. An amplifier arrangement according to claim 1, wherein said side band filter terminates said reactance modulator at least nearly reflection-free for the stable side band.

5. An amplifier arrangement as defined in claim 1, wherein the passed side band frequency is the lower side band.

References Cited by the Examiner

UNITED STATES PATENTS

| | | | |
|---|---|---|---|
| 2,719,223 | 9/55 | Van der Ziel et al. | |
| 2,836,722 | 5/58 | Dicke et al. | 330—4 |
| 3,048,783 | 8/62 | Warren et al. | 325—445 |

OTHER REFERENCES

RCA Review, June 1959, pages 205–221, "Analysis of a Four-Terminal Parametric Amplifier," by Kern K.N. Chang.

ROY LAKE, *Primary Examiner.*

ELI J. SAX, NATHAN KAUFMAN, *Examiners.*